United States Patent
Yin et al.

(10) Patent No.: US 12,235,298 B2
(45) Date of Patent: Feb. 25, 2025

(54) DETECTION CIRCUIT, APPLIANCE AND CONTROL METHOD

(71) Applicants: Guangdong Midea White Home Appliance Technology Innovation Center Co., Ltd., Foshan (CN); Midea Group Co., Ltd., Foshan (CN)

(72) Inventors: Kunren Yin, Foshan (CN); Hui Liao, Foshan (CN)

(73) Assignees: GUANGDONG MIDEA WHITE HOME APPLIANCE TECHNOLOGY INNOVATION CENTER CO., LTD., Foshan (CN); MIDEA GROUP CO., LTD., Foshan (CN)

( * ) Notice: Subject to any disclaimer, the term of this patent is extended or adjusted under 35 U.S.C. 154(b) by 507 days.

(21) Appl. No.: 17/674,217

(22) Filed: Feb. 17, 2022

(65) Prior Publication Data

US 2022/0170966 A1    Jun. 2, 2022

Related U.S. Application Data

(63) Continuation of application No. PCT/CN2019/123405, filed on Dec. 5, 2019.

(30) Foreign Application Priority Data

Aug. 19, 2019 (CN) .................. 201910766202.X

(51) Int. Cl.
 *G01R 21/00* (2006.01)
 *G01R 27/26* (2006.01)
 *G05B 15/02* (2006.01)
(52) U.S. Cl.
 CPC .......... *G01R 21/00* (2013.01); *G01R 27/2605* (2013.01); *G05B 15/02* (2013.01)

(58) Field of Classification Search
 CPC .. G01R 19/145; G01R 21/00; G01R 27/2605; G01R 27/2611; G01R 27/2688; G01R 27/2694; G01R 27/28; G05B 15/02
 See application file for complete search history.

(56) References Cited

U.S. PATENT DOCUMENTS 10,893,579 B2 * 1/2021 Calesella ............... H05B 6/065
2008/0157603 A1   7/2008 Baarman et al.
(Continued)

FOREIGN PATENT DOCUMENTS

CN            1816226 A      8/2006
CN         101335468 A     12/2008
(Continued)

OTHER PUBLICATIONS

Guangdong Meidi White Household Appliances Technology Innovation Center Co., Ltd., Notification to Grant Patent Right for Invention, CN Application No. 201910766202.X, Jun. 22, 2021, 6 pgs.

(Continued)

*Primary Examiner* — Neel D Shah
*Assistant Examiner* — Adam S Clarke
(74) *Attorney, Agent, or Firm* — Morgan, Lewis & Bockius LLP

(57) ABSTRACT

The present disclosure relates to a detection circuit, an appliance, and a control method. The detection circuit includes at least a first capacitive component, a second capacitive component, a load to be detected and a detection component, where the first capacitive component is connected in series with the load to be detected to form a first branch, and the first branch is connected in parallel with a second branch including the second capacitive component. The detection component is configured to detect a first alternating current (AC) signal of the first branch and a (Continued)

second AC signal of the second branch, determine a first direction of the first AC signal and a second direction of the second AC signal, and determine a type of the load to be detected based on the first direction and the second direction.

16 Claims, 3 Drawing Sheets

(56) References Cited

U.S. PATENT DOCUMENTS

| | | | |
|---|---|---|---|
| 2014/0158680 A1 | 6/2014 | Kitaizumi et al. | |
| 2015/0245416 A1 | 8/2015 | Yoshino et al. | |
| 2015/0309092 A1 * | 10/2015 | Yu | G01R 23/00 702/66 |
| 2019/0131824 A1 | 5/2019 | Suga et al. | |

FOREIGN PATENT DOCUMENTS

| | | |
|---|---|---|
| CN | 103262647 A | 8/2013 |
| CN | 102257878 B | 9/2013 |
| CN | 103513128 A | 1/2014 |
| CN | 104485759 A | 4/2015 |
| CN | 104604328 A | 5/2015 |
| CN | 104634398 A | 5/2015 |
| CN | 104764954 A | 7/2015 |
| CN | 106685102 A | 5/2017 |
| CN | 107852784 A | 3/2018 |
| CN | 207117238 U | 3/2018 |
| CN | 107979884 A | 5/2018 |
| CN | 109417311 A | 3/2019 |
| CN | 109466350 A | 3/2019 |
| EP | 2914059 A1 * | 9/2015 ............ H05B 6/065 |
| JP | S 4925539 A | 3/1974 |
| JP | H 04269488 A | 9/1992 |
| JP | 2002299028 A | 10/2002 |
| JP | 3546279 B2 | 7/2004 |
| JP | 2005093089 A | 4/2005 |
| JP | 2005129539 A | 5/2005 |
| JP | 2006114320 A | 4/2006 |
| JP | 2006332076 A | 12/2006 |
| JP | 2009163915 A | 7/2009 |
| JP | 2009224251 A | 10/2009 |
| JP | 2010515425 A | 5/2010 |
| JP | 2011507481 A | 3/2011 |
| JP | 2011181325 A | 9/2011 |
| JP | 2012054179 A | 3/2012 |
| JP | 5992131 B1 | 9/2016 |
| WO | WO 2012066623 A1 | 5/2012 |
| WO | WO 2013094174 A1 | 6/2013 |
| WO | WO 2014068647 A1 | 5/2014 |
| WO | WO 2018003092 A1 | 1/2018 |
| WO | WO 2018225755 A1 | 12/2018 |

OTHER PUBLICATIONS

International Search Report, International Application No. PCT/CN2019/123405, Apr. 28, 2020, 5 pgs.

Midea Group Co., Ltd., Japanese Notice of Allowance, JP Patent Application No. 2022-504695, Jul. 25, 2023, 7 pgs.

Chaoqiang Jiang et al., "An Overview of Resonant Circuits for Wireless Power Transfer", Energies Journal, vol. 10, No. 7, Jun. 30, 2017, XP055921196, 20 pgs.

Extended European Search Report, EP19942462.3, Jun. 29, 2022, 7 pgs.

Midea Group Co., Ltd., WO, PCT/CN2019/123405, Apr. 28, 2020, 4 pgs.

Midea Group Co., Ltd., IPRP, PCT/CN2019/123405, Feb. 17, 2022, 5 pgs.

Midea Group Co., Ltd., Japanese Office Action, JP Patent Application No. 2022-504695, Mar. 7, 2023, 10 pgs.

* cited by examiner

DETECTION CIRCUIT, APPLIANCE AND CONTROL METHOD

CROSS-REFERENCE TO RELATED APPLICATION

This application is a continuation of PCT International Application No. PCT/CN2019/123405, filed Dec. 5, 2019, which claims the benefit of the Chinese Patent Application No. 201910766202.X filed on Aug. 19, 2019, the entire contents of which are hereby incorporated by reference.

TECHNICAL FIELD

The present disclosure relates to the field of appliances, and in particular to a detection circuit, an appliance and a control method.

BACKGROUND

A certain type of appliance in related arts, such as an induction cooker, is capable of heating the cookware or charging a power receiving device. When such an appliance is used, may be necessary for the user to artificially determine the type of load and then select a corresponding button to activate the appliance, so as to enable the appliance to be in a corresponding operation mode. Otherwise, an unexpected risk may be caused and the appliance may even be damaged.

SUMMARY

Embodiments of the present disclosure provide a detection circuit, an appliance, and a control method, which can at least partially solve the technical problems.

In order to achieve the above objects, the technical solutions of the embodiments of the present disclosure are realized as follows.

Some embodiments of the present disclosure provides a detection circuit including at least a first capacitive component, a second capacitive component, a load to be detected and a detection component.

The first capacitive component is connected in series with the load to be detected to form a first branch, and the first branch is connected in parallel with a second branch including the second capacitive component.

The detection component is configured to detect a first alternating current (AC) signal of the first branch and a second AC signal of the second branch, determine a first direction of the first AC signal and a second direction of the second AC signal, and determine a type of the load to be detected based on the first direction and the second direction.

In some alternative embodiments of the present disclosure, the detection component is configured to detect whether an included angle between the first direction and the second direction is within a first preset range; in a case where it is detected that the included angle between the first direction and the second direction is within the first preset range, determine that the type of the load to be detected is a power transmission load; and in a case where it is detected that the included angle between the first direction and the second direction is not within the first preset range, determine that the type of the load to be detected is a heating load.

In some alternative embodiments of the present disclosure, the first capacitive component includes a first capacitor; or the first capacitive component includes the first capacitor and at least one of a first inductor or a first resistor, where the first capacitor is connected in series with the at least one of the first inductor or the first resistor; and the second capacitive component includes a second capacitor; or the second capacitive component includes the second capacitor and at least one of a second inductor or a second resistor, where the second capacitor is connected in series with the at least one of the second inductor or the second resistor.

In some alternative embodiments of the present disclosure, the detection circuit further includes a third branch including an inductive component, where an end of the third branch is connected to an AC power source, the third branch is connected in series with the first branch and the second branch respectively; a third AC signal of the third branch includes the first AC signal and the second AC signal; and the inductive component is configured to perform filtering or compensation processing on an AC signal output from the AC power source.

In some alternative embodiments of the present disclosure, the detection component is configured to detect a first moment corresponding to a voltage zero-crossing point of the third AC signal and a second moment corresponding to a current zero-crossing point of the third AC signal, and determine the type of the load to be detected based on the first moment and the second moment.

In some alternative embodiments of the present disclosure, the detection component is configured to detect whether a difference between the first moment and the second moment is within a second preset range; in a case where it is detected that the difference between the first moment and the second moment is within the second preset range, determine that the type of the load to be detected is a power transmission load; and in a case where it is detected that the difference between the first moment and the second moment is not within the second preset range, determine that the type of the load to be detected is a heating load.

In some alternative embodiments of the present disclosure, the inductive component includes a third inductor; or the inductive component includes the third inductor and at least one of a third capacitor or a third resistor, where the third inductor is connected in series with the at least one of the third capacitor and the third resistor.

Some embodiments of the present disclosure further provides an appliance including the detection circuitry described in any of the above schemes, the appliance further including a control component configured to control the appliance to be in a corresponding operating mode based on the type of the load to be detected determined by the detection component of the detection circuit.

In some alternative embodiments of the present disclosure, the load to be detected includes a cookware or a power receiving device; and the control component is configured to heat, through a coil plate of the appliance, the cookware placed on the coil plate in a case where the type of the load to be detected determined by the detection component is a heating load; and transmit, through the coil plate of the appliance, power to the power receiving device placed on the coil plate in a case where the type of the load to be detected determined by the detection component is a power transmission load.

Some embodiments of the present disclosure further provide a control method applied to the appliance in any one of the above schemes. The method includes:

a first alternating current (AC) signal of a first branch and a second AC signal of a second branch in a detection circuit are obtained, and a first direction of the first AC signal and a second direction of the second AC signal are determined, where the first branch includes a first capacitive component and a load to be detected connected in series, and the first branch is connected in parallel with a second branch including a second capacitive component;

a type of the load to be detected is determined based on the first direction and the second direction; and the appliance is controlled to be in a corresponding operating mode based on the type of load to be detected.

In some alternative embodiments of the present disclosure, the operation that the type of the load to be detected is determined based on the first direction and the second direction includes:

it is detected whether an included angle between the first direction and the second direction is within a first preset range; and in a case where it is detected that the included angle between the first direction and the second direction is within the first preset range, it is determined that the type of the load to be detected is a power transmission load; and in a case where it is detected that the included angle between the first direction and the second direction is not within the first preset range, it is determined that the type of the load to be detected is a heating load.

In some alternative embodiments of the present disclosure, the method further includes:

a third AC signal of a third branch of the detection circuit is obtained, and a first moment corresponding to a voltage zero-crossing point of the third AC signal and a second moment corresponding to a current zero-crossing point of the third AC signal are determined; and the type of the load to be detected is determined based on the first moment and the second moment.

In some alternative embodiments of the present disclosure, the operation that the type of the load to be detected is determined based on the first moment and the second moment includes:

it is detected whether a difference between the first moment and the second moment is within a second preset range;

in a case where it is detected that the difference between the first moment and the second moment is within the second preset range, it is determined that the type of the load to be detected is a power transmission load; and in a case where it is detected that the difference between the first moment and the second moment is not within the second preset range, it is determined that the type of the load to be detected is a heating load.

Some embodiments of the present disclosure further provide a computer-readable storage medium having stored thereon computer programs that, when executed by a processor, cause the processor to implement the steps of the method described in some embodiments of the present disclosure.

Some embodiments of the present disclosure further provides a detection device including a processor and a memory storing computer programs capable of running on the processor, where the processor is configured to perform the steps of the method described in some embodiments of the present disclosure when the computer program is executed.

Embodiments of the present disclosure provide a detection circuit, an appliance, and a control method. The detection circuit includes at least a first capacitive component, a second capacitive component, a load to be detected and a detection component, where the first capacitive component is connected in series with the load to be detected to form a first branch, and the first branch is connected in parallel with a second branch including the second capacitive component; and the detection component is configured to detect a first alternating current (AC) signal of the first branch and a second AC signal of the second branch, determine a first direction of the first AC signal and a second direction of the second AC signal, and determine a type of the load to be detected based on the first direction and the second direction. By using the technical solutions of the embodiments of the present disclosure, on the one hand, the directions of the AC signals of the first branch and the second branch are detected, the type of the load to be detected is automatically determined based on the detected directions. On the other hand, application of the detection circuit to the appliance implements intelligent recognition of the type of the load to be detected, and enables the appliance to automatically operate in the corresponding operating mode, so that the appliance is more intelligent, the user requirements are met, the safety of the appliance is improved, and the user experience is improved.

DETAILED DESCRIPTION

Figure 1:
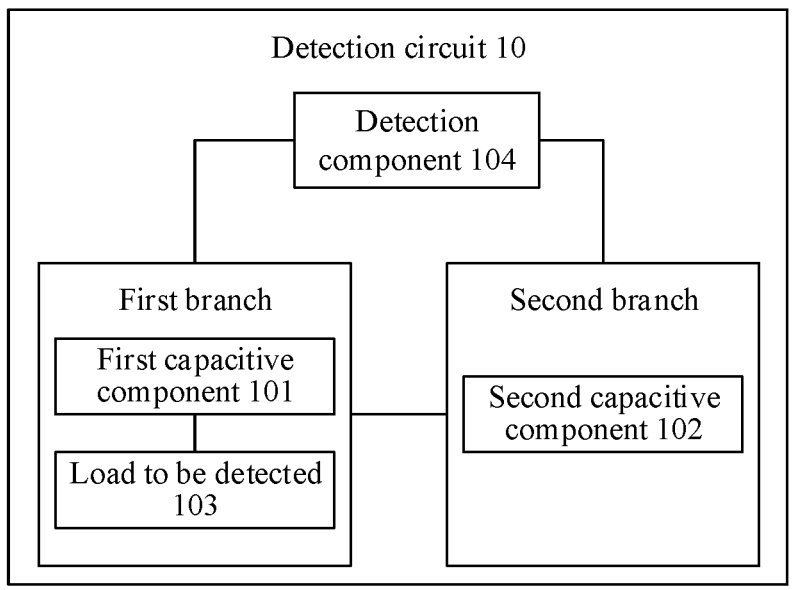
FIG. 1 is a schematic structural diagram of a detection circuit according to some embodiments of the present disclosure.

Embodiments of the present disclosure are described in detail below, the examples of which are shown in the accompanying drawings, where identical or similar reference numerals denote identical or similar elements or elements having the identical or similar functions throughout. The embodiments described below by reference to the accompanying drawings are exemplary and intended to explain the present disclosure, which not being construed as limiting the present disclosure.

In order to facilitate understanding of the embodiments of the present disclosure, the electromagnetic heating technology and the wireless power transmission technology in the related art will be briefly described below by taking an induction cooker as an example.

Induction cookers, also known as electromagnetic cookers, are classified into two types, i.e., industrial-frequency (low-frequency) induction cookers and high-frequency induction cookers. The induction cooker works according to the electromagnetic induction principle to heat food in the cooker by converting electrical energy into thermal energy. Taking a high-frequency induction cooker as an example, the specific working principle is as follows. First of all, the alternating current of the 50/60 Hz the is converted into a direct current by using a rectifier circuit, and then the direct current is converted into a high-frequency signal having a frequency of 20~35 KHz by using the control circuit, so that the high-speed changing current flows through the coil to generate a high-speed changing magnetic field. Therefore, when magnetic lines in the magnetic field pass through the bottom of the metal cooker, numerous small eddy currents are generated in the metal body, so that the cooker self-heats in a high speed, and then the food in the cooker are heated to achieve a result of being used by the user.

The transmission of electric energy is an intermediate link between power generation and electricity consumption in a power system. As a special power transmission mode, wireless power transmission can be classified into four main categories according to different principles: electromagnetic induction, resonant wireless power transmission, magnetic coupling resonance, and microwave wireless power transmission. By adopting one of the above four categories, energy coupling can be implemented without physical connection between a power source and a power receiving device, that is, energy can be transmitted between objects. In the wireless power transmission mode, it is only required that the power receiving device is placed in a designated position, herein the power receiving device has a wireless charging standard same as that of the wireless power transmission device (for example, an induction cooker), for example, a Power Matters Alliance (PMA) standard, a Qi standard, an Alliance for Wireless Power (A4WP) standard, or the like.

Both the electromagnetic heating technology and the wireless power transmission technology adopt energy coupling, based on which appliances having an electromagnetic heating function and a wireless power transmission function appear in the related art. However, at present, the appliance cannot intelligently recognize the type of a placed load, instead, the user may need to select and set the type of the load. In this case, if the user selects the type of the load incorrectly, the appliance may fail to work normally and even be damaged. Accordingly, the embodiments of the present disclosure are intended to provide a detection scheme capable of intelligently recognizing a type of a load placed on an appliance, so that the appliance operates in a corresponding operating mode based on the recognized type of the load.

The detection circuit, appliance and control method proposed in the embodiments of the present disclosure will be described in detail below with reference to the accompanying drawings.

FIG. 1 is a schematic structural diagram of a detection circuit according to some embodiments of the present disclosure. As shown in FIG. 1, the detection circuit includes at least a first capacitive component 101, a second capacitive component 102, a load to be detected 103, and a detection component 104.

The first capacitive component 101 is connected in series with the load to be detected 103 to form a first branch, and the first branch is connected in parallel with a second branch including the second capacitive component 102.

The detection component 104 is configured to detect a first alternating current (AC) signal of the first branch and a second AC signal of the second branch, determine a first direction of the first AC signal and a second direction of the second AC signal, and determine a type of the load to be detected based on the first direction and the second direction.

In this embodiment, capacitive components (including the first capacitive component 101 and the second capacitive component 102) refer to components having capacitive parameters, that is, components conforming to a characteristic that the voltage lags behind the current.

In this embodiment, the first capacitive component may be in various forms as long as the first capacitive component is capacitive and meets the requirements of the detection circuit. In an alternative embodiment, the first capacitive component 101 may include a first capacitance. In another alternative embodiment, the first capacitive component 101 may include a first capacitor and at least one of a first inductor or a first resistor, where first capacitor is connected in series with the at least one of the first inductor or the first resistor. Similarly, the second capacitive component 102 may also be in various forms, and in an alternative embodiment, the second capacitive component 102 may include a second capacitor. In another alternative embodiment, the second capacitive component 102 may include the second capacitor and at least one of a second inductor or a second resistor, where the second capacitor is connected in series with the at least one of the second inductor or the second resistor. It is to be understood that the terms "first" and "second" herein are only to distinguish between similar elements for ease of the subsequent description, and are not intended to limit the present disclosure.

It is to be understood that since the first branch is connected in parallel with the second branch, the voltage value across the first branch is theoretically equal to the voltage value across the second branch. Therefore, in this embodiment, the first direction of the first AC signal refers to the current direction of the first AC signal of the first branch; and the second direction of the second AC signal refers to the current direction of the second AC signal of the second branch.

In practical applications, the type of load to be detected may include two types: a power transmission load and a heating load, where the power transmission load may be understood as a power receiving device, i.e., a device that obtains electrical energy through wireless power transmission technology; and the heating load is an device that obtains thermal energy converted from electrical energy through the electromagnetic induction principle. Exemplarily, the power receiving device corresponding to the transmission load may be a terminal device having a wireless charging function, such as a mobile phone. The heating load may be a cookware or the like that can be used for electromagnetic heating.

Exemplarily, in a case where it is detected that an included angle between the current direction of the first AC signal of the first branch and the current direction of the second AC signal of the second branch is close to 90°, it may be determined that the load to be detected is a power transmission load; and in a case where it is detected that the included angle between the current direction of the first AC signal of the first branch and the current direction of the second AC signal of the second branch is not close to 90°, it is determined that the load type to be detected is a heating load.

Therefore, in some alternative embodiments of the present disclosure, when the type of the load to be detected is determined by using the detection circuit 10, the detection component 104 is configured to detect whether the included angle between the first direction and the second direction is within a first preset range. In a case where it is detected that the included angle between the first direction and the second direction is within the first preset range, it is determined that the type of the load to be detected is a power transmission load; and in a case where it is detected that the included angle between the first direction and the second direction is not within the first preset range, it is determined that the type of the load to be detected is a heating load.

The first preset range may be set according to requirements, which is not limited in this embodiment.

For example, the first preset range (80°, 100°) indicates a range greater than 80° and less than 100°. In a case where it is detected that the included angle between the first direction of the current signal of the first branch and the second direction of the current signal of the second branch falls into (80°, 100°), for example, the included angle between the first direction and the second direction is 85°, it is determined that the load to be detected is a power transmission load; and in a case where it is detected that the included angle between the first direction of the current signal of the first branch and the second direction of the current signal of the second branch does not fall into (80°, 100°), for example, the included angle between the first direction and the second direction is 75°, it is determined that the load to be detected is a heating load.

Figure 2:
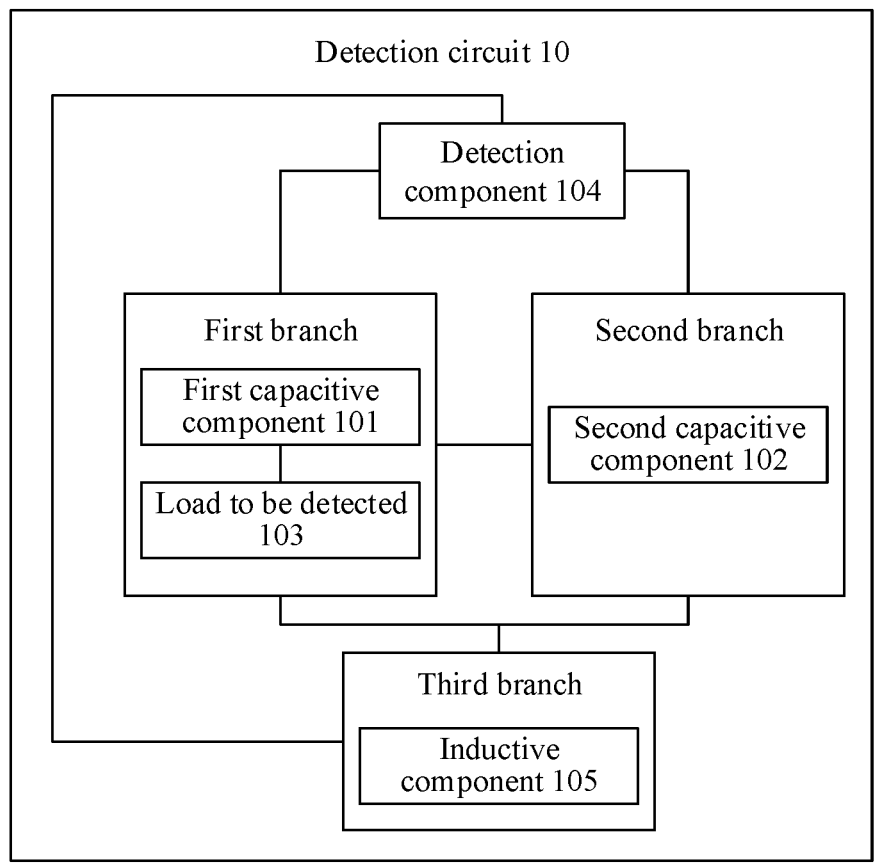
FIG. 2 is a schematic structural diagram of another detection circuit according to some embodiments of the present disclosure.

Based on the above-described similar application concept of determining the type of the load to be detected, as shown in FIG. 2, some embodiments of the present disclosure further provide a schematic structural diagram of another detection circuit 10. The detection circuit 10 includes a third branch including the inductive component 105. An end of the third branch is connected to an AC power source, where the third branch is connected in series with the first branch and the second branch respectively; a third AC signal of the third branch includes the first AC signal and the second AC signal; and the inductive component 105 is configured to perform filtering or compensation processing on an AC signal output from the AC power source. It can be understood that one end of the third branch is connected to the AC power source; and the other end of the third branch is connected to one end of the first branch and one end of the second branch, respectively.

In this embodiment, the inductive component 105 refers to a component having an inductive parameter, that is, a component having a characteristic that the load current lags behind the load voltage by a phase difference.

In this embodiment, the inductive component 105 may be in various forms as long as the characteristic of the inductive component is met. Based on this, in an alternative embodiment, the inductive component 105 may include a third inductor. In another alternative embodiment, the inductive component 105 may include the third inductor and at least one of a third capacitor or a third resistor, where the third inductor is connected in series with the at least one of the third capacitor and the third resistor.

It is to be noted that the third branch is located on the AC power source side and has a common node to the first branch and the second branch, respectively. According to Kirchhoff's laws, in one circuit node, the outflow current signal is equal to the inflow current signal, that is, the current of the third AC signal of the third branch is equal to the sum of the current of the first AC signal of the first branch and the current of the second AC signal of the second branch.

In some embodiments, the inductive component 105 is configured to perform filtering or compensation processing on the AC signal output from the AC power source. The type of the AC power source in the present embodiments is not limited, as long as the AC signal can be supplied to the detection circuit 10, which is not limited herein. In practical applications, for example, an AC signal output from an inverting bridge circuit may be used as the AC power source. It is to be understood that the AC signal includes physical quantities such as an AC voltage and an AC current, and the AC signal outputted from the inverting bridge circuit is mostly a square wave and contains a large number of higher harmonics. The inductive component 105 allows the low frequency to pass through while blocking the high frequency to filter out the higher harmonics contained in the AC signal, so that the AC signal only contains fundamental waves (sinusoidal waves), such as a voltage having a sinusoidal waveform and a current having a sinusoidal waveform.

In this embodiment, when the equivalent impedance after the first branch circuit is connected in parallel with the second branch circuit is resistive, that is, when the voltage signal and the current signal of the third branch circuit are in phase, it is determined that the load to be detected 103 is a power transmission load; and when the equivalent impedance after the first branch circuit is connected in parallel with the second branch circuit is not resistive, that is, when the voltage signal and the current signal of the third branch circuit are not in phase, it is determined that the load to be detected 103 is a heating load.

Based on this, the detection component 104 is configured to detect a first moment corresponding to a voltage zero-crossing point of the third AC signal and a second moment corresponding to a current zero-crossing point of the third AC signal, and determine the type of the load to be detected based on the first moment and the second moment.

In some embodiments, the detection component 104 is configured to detect whether a difference between the first moment and the second moment is within a second preset range; in a case where it is detected that the difference between the first moment and the second moment is within the second preset range, determine that the type of the load to be detected 103 is a power transmission load; and in a case where it is detected that the difference between the first moment and the second moment is not within the second preset range, determine that the type of the load to be detected 103 is a heating load.

The second preset range may be set according to requirements, which is not limited in this embodiment.

For example, the second preset range (−0.2, +0.2) indicates a range greater than −0.2 and less than 0.2. In a case where it is detected that the difference between the first moment corresponding to a voltage zero-crossing point of the third AC signal and the second moment corresponding to a voltage zero-crossing point of the third AC signal falls into (−0.2, +0.2), for example, the difference between the first moment and the second moment is 0.01, it is determined that the load to be detected 103 is a power transmission load; and in a case where it is detected that the difference between the first moment corresponding to a voltage zero-crossing point of the third AC signal and the second moment corresponding to a voltage zero-crossing point of the third AC signal does not fall into (−0.2, +0.2), for example, the difference between the first moment and the second moment is 0.5, it is determined that the load to be detected 103 is a heating load.

According to the technical solutions of the embodiments of the present disclosure, by detecting the directions of the AC signals of the first branch and the second branch, the type of the load to be detected is automatically determined based on the detected directions.

Figure 3:
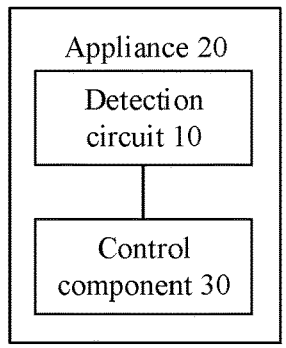
FIG. 3 is a schematic structural diagram of an appliance including a detection circuit provided in some embodiments of the present disclosure.

As shown in FIG. 3, some embodiments of the present disclosure further provide an appliance 20 including any of the above-described detection circuits 10. The appliance 20 further includes a control component 30 configured to control the appliance to be in a corresponding operating mode based on the type of the load to be detected 103 determined by the detection component 104 of the detection circuit 10.

In this embodiment, the operation modes of the appliance 20 include at least a power transmission operation mode and a heating operation mode. In practical applications, the appliance 20 may include at least a power transmission circuit and a heating circuit. The power transmission operation mode may represent that a coil plate in the appliance 20 is switched to connect with the power transmission circuit to transmit electric energy to the load to be detected 103 through the power transmission circuit; and the heating operation mode may represent that a coil plate in the appliance 20 is switched to connect with the heating circuit to heat the load to be detected 103 through the heating circuit. It is to be appreciated that in a case where the detection circuit 10 detects that the type of the load to be detected 103 is a heating load, the control component 30 controls the appliance 20 to be in a heating operation mode; and in a case where the detection circuit 10 detects that the type of the load to be detected 103 is the power transmission load, the control component 30 controls the appliance 20 to be in the power transmission operation mode. Thus, it is possible to avoid cases where the appliance 20 or the load to be detected 103 is damaged due to an error in the manual selection of operating mode.

In practical applications, in a case where the load to be detected 103 includes a cookware or a power receiving device, the control component 30 is configured to heat, through a coil plate of the appliance 20, the cookware placed on the coil plate in a case where the type of the load to be detected 103 determined by the detection component 104 is a heating load; and transmit, through the coil plate of the appliance 20, power to the power receiving device placed on the coil plate in a case where the type of the load to be detected 103 determined by the detection component 104 is a power transmission load.

It is to be understood that the appliance 20 may be any appliance having the detection circuit 10 and the control component 30 described above. According to some specific embodiments of the present disclosure, the appliance 20 may be an induction cooker, and the load to be detected 103 may include a cookware capable of being heated through electromagnetic heating or a mixing cup capable of being charged through wireless charging. For example, in the case where the cookware is placed on the coil plate of the induction cooker, the induction cooker automatically recognizes the type of the cookware by the detection circuit 10 included in the induction cooker, and controls itself to be in the heating operation mode by the control component 30 included in the induction cooker to heat the cookware. For another example, in the case where the mixing cup is placed on the induction cooker, the induction cooker automatically recognizes the type of the mixing cup by the detection circuit 10 included in the induction cooker and controls itself to be in the power transmission operation mode by the control component 30 included in the induction cooker to charge the battery of the mixing cup.

By using the technical solutions of the embodiments of the present disclosure, application of the detection circuit to the appliance implements intelligent recognition of the type of the load to be detected, and enables the appliance to automatically operate in the corresponding operating mode, so that the appliance is more intelligent, the user requirements are met, the safety of the appliance is improved, and the user experience is improved.

Figure 4:
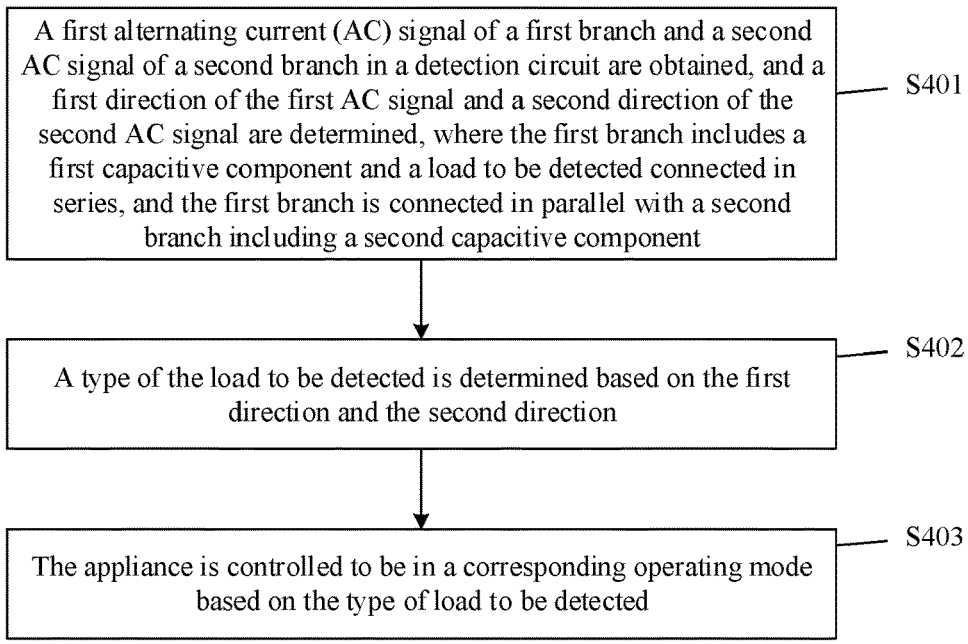
FIG. 4 is a flowchart of a control method according to some embodiments of the present disclosure.

Based on a similar concept as described above, as shown in FIG. 4, there is shown a flowchart of a control method according to some embodiments of the present disclosure. The method is applied to any of the above-described appliances 20, and includes operations S401 to S403.

In operation S401, a first alternating current (AC) signal of a first branch and a second AC signal of a second branch in a detection circuit are obtained, and a first direction of the first AC signal and a second direction of the second AC signal are determined, where the first branch includes a first capacitive component and a load to be detected connected in series, and the first branch is connected in parallel with a second branch including a second capacitive component.

In operation S402, a type of the load to be detected is determined based on the first direction and the second direction.

In operation S403, the appliance is controlled to be in a corresponding operating mode based on the type of load to be detected.

Optionally, for operation S402, the method further includes operations S4021 to S4022.

In operation S4021, it is detected whether an included angle between the first direction and the second direction is within a first preset range.

In operation S4022, in a case where it is detected that the included angle between the first direction and the second direction is within the first preset range, it is determined that the type of the load to be detected is a power transmission load; and in a case where it is detected that the included angle between the first direction and the second direction is not within the first preset range, it is determined that the type of the load to be detected is a heating load.

Figure 5:
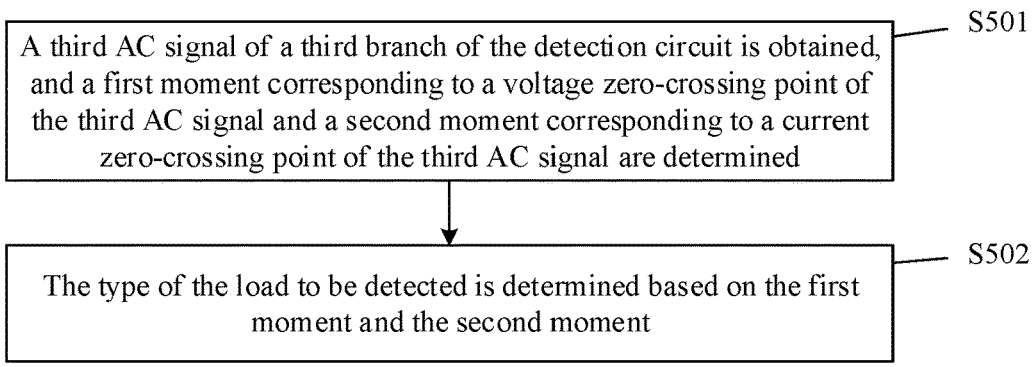
FIG. 5 is a flowchart of another control method according to some embodiments of the present disclosure.

Based on the foregoing method embodiments, as shown in FIG. 5, which shows a flowchart of another control method according to some embodiments of the present disclosure, the method further includes operations S501 to S502.

In operation S501, a third AC signal of a third branch of the detection circuit is obtained, and a first moment corresponding to a voltage zero-crossing point of the third AC signal and a second moment corresponding to a current zero-crossing point of the third AC signal are determined.

In operation S502, the type of the load to be detected is determined based on the first moment and the second moment.

Herein, the operation S502 includes operations S5021 to S5022.

In operation S5021, it is detected whether a difference between the first moment and the second moment is within a second preset range.

In operation S5022, in a case where it is detected that the difference between the first moment and the second moment is within the second preset range, it is determined that the type of the load to be detected is a power transmission load; and in a case where it is detected that the difference between the first moment and the second moment is not within the second preset range, it is determined that the type of the load to be detected is a heating load.

For detailed description of the method embodiments of the present disclosure, reference can be made to the description of the detection circuit and the appliance embodiments described above, and details are not described herein again.

For a clearer understanding of the concepts of the embodiments of the present disclosure, a specific example will be described below.

Figure 6:
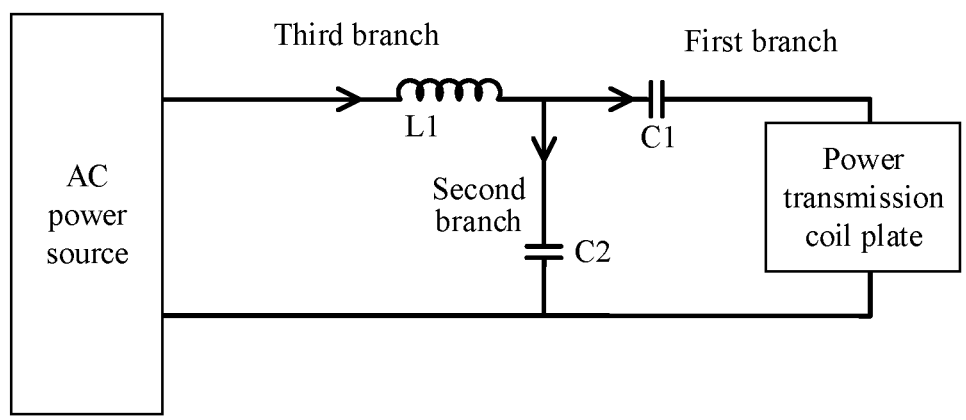
FIG. 6 is a schematic diagram of a circuit topology including a detection circuit according to some embodiments of the present disclosure.

FIG. 6 is a schematic diagram of a circuit topology including a detection circuit according to some embodiments of the present disclosure, as shown in FIG. 6. In the circuit topology, an AC power source, a first branch, a second branch, a third branch, and a power transmission coil plate are included. The first branch includes a first capacitive component and a power transmission coil plate; the second branch includes a second capacitive component; and the third branch includes an inductive component; The first capacitive component includes a first capacitor (such as capacitor C1 in FIG. 6); the second capacitive component includes a second capacitor (such as capacitor C2 in FIG. 6); and the inductive component includes a third inductor (such as inductor L1 in FIG. 6). The first capacitor of the first branch is connected in series with the load to be detected, and connected in parallel with the second branch. The third branch is connected in series with the first branch and the second branch, respectively. Different types of the loads to be detected may be placed on the power transmission coil plate, for example, a power transmission load may be placed or a heating load may be placed.

In this circuit topology, the type of load to be detected can be determined in the following two manners.

In a first manner, the type of load to be detected is determined by using a first AC signal of the first branch and a second AC signal of the second branch. A relationship between the first AC signal and the second AC signal is obtained, and a type of load to be detected is determined based on the relationship between the first AC signal and the second AC signal.

Optionally, the first direction of the first AC signal of the first branch and the second direction of the second AC signal of the second branch are detected, and it is determined whether the included angle between the first direction and the second direction is within a first preset range (for example, whether the included angle between the first direction and the second direction is close to 90°). In a case where the included angle between the first direction and the second direction is within the first preset range, it is determined that the load to be detected is a power transmission load; and in a case where the included angle between the first direction and the second direction is not within the first preset range, it is determined that the load to be detected is the heating load.

In a second manner, the type of load to be detected is determined by using a moment corresponding to a voltage zero-crossing point of the third AC signal of the third brunch and a moment corresponding to a current zero-crossing point of the third AC signal of the third brunch.

Optionally, a first moment corresponding to a voltage zero-crossing point of the third AC signal and a second moment corresponding to a current zero-crossing point of the third AC signal are detected. It is detected whether a difference between the first moment and the second moment is within a second preset range. In a case where the difference between the first moment and the second moment is within the second preset range, it is determined that the type of the load to be detected is a power transmission load; and in a case where the difference between the first moment and the second moment is not within the second preset range, it is determined that the type of the load to be detected is a heating load.

It is to be understood that the above two determination manners may exist simultaneously or one of them may be selected, which is determined according to the initial setting of the user. When both of the two determination manners exist, the two determination manners can be used as a check for each other. If the results of the two determination manners are inconsistent, it is determined that the detection circuit is faulty or the detection tool is faulty, and the appliance including the detection circuit is stopped from working, thereby further improving the safety of the appliance including the detection circuit.

It is to be noted that in the present disclosure, the above two determination manners are adopted as embodiments to explain the concept of the disclosure. It is to be understood that, with respect to the circuit topology, it can also be determined whether a difference is within a third preset range, the difference being between a sum of the square of the current value of the first AC signal of the first branch and the square of the current value of the second AC signal of the second branch, and the square of the current value of the third AC signal of the third branch. That is, a difference value is calculated that is between the sum of the square of the current value of the first AC signal of the first branch and the square of the current value of the second AC signal of the second branch, and the square of the current value of the third AC signal of the third branch; and it is determined whether the difference value is within the third preset range. In a case where the difference value is within the third preset range, it is determined that the type of the load to be detected is the power transmission load; and in a case where the difference value is not within the third preset range, it is determined that the type of the load to be detected is a heating load. The third preset range may be set according to actual requirements, which is not specifically limited in this embodiment.

For example, the third preset range is set to (−0.5, 0.5), in a case where the difference value between the sum of the square of the current value of the first AC signal of the first branch and the square of the current value of the second AC signal of the second branch and the square of the current value of the third AC signal of the third branch falls into (−0.5, 0.5), for example, the difference value is 0.3, then it is determined that the load to be detected is a power transmission load; and in a case where the difference value between the sum of the square of the current value of the first AC signal of the first branch and the square of the current value of the second AC signal of the second branch and the square of the current value of the third AC signal of the third branch does not fall into (−0.5, 0.5), for example, the difference value is 0.7, then it is determined that the load to be detected is the heating load.

To sum up, according to the detection circuit, the appliance and the control method provided in the embodiments of the present disclosure, the type of the load to be detected is determined by the detection circuit, so that the appliance is enabled to be automatically in the corresponding operation mode according to the different load types, thereby avoiding the risk that the appliance cannot work normally or is even damaged due to a wrong button being started by the user.

Some embodiments of the present disclosure further provide a detection device including a processor and a memory storing computer programs capable of running on the processor, where the processor is configured to perform the operations of the method described in the embodiments of the present disclosure when the computer programs are executed. Exemplarily, the detection device may include a detection component 104 described in the foregoing embodiments.

It will be appreciated that the memory may be volatile or non-volatile memory, or may include both volatile and non-volatile memory. The non-volatile memory may be a Read Only Memory (ROM), a Programmable Read-Only Memory (PROM), an Erasable Programmable Read-Only Memory (EPROM), an Electrically Erasable Programmable Read-Only Memory (EEPROM), a ferromagnetic random access memory (FRAM), a Flash Memory, a magnetic surface memory, an optical disc, or an Compact Disc Read-Only Memory (CD-ROM), the magnetic surface memory may be a magnetic disk memory or a magnetic tape storage. The volatile memory may be a Random Access Memory (RAM) that functions as an external cache. By way of example, but not limitation, many forms of RAMs may be used, such as a Static Random Access Memory (SRAMs), Synchronous Static Random Access Memory (SSRAM), Dynamic Random Access Memory (DRAM), Synchronous Dynamic Random Access Memory (SDRAM), Double Data Rate Synchronous Dynamic Random Access Memory (DDRSDRAM), Enhanced Synchronous Dynamic Random Access Memory (ESDRAM), SyncLink Dynamic Random Access Memory (SLDRAM), Direct Rambus Random Access Memory (DRRAM). The memories described in the embodiments of the present disclosure are intended to include, but are not limited to, these and any other suitable types of memories.

The method disclosed in the above embodiments of the present disclosure may be applied to, or implemented by, a processor. The processor may be an integrated circuit chip having signal processing capabilities. In an implementation, the operations of the above method may be implemented by integrated logic circuitry of the hardware in the processor or instructions in the form of software. The above-described processor may be a general purpose processor, a Digital Signal Processor (DSP), or other programmable logic device, discrete gate or transistor logic device, discrete hardware component, or the like. The processor may implement or perform the methods, operations, and logical block diagrams disclosed in the embodiments of the present disclosure. The general purpose processor may be a microprocessor or any conventional processor or the like. The operations of the method disclosed in the embodiments of the present disclosure may be directly performed by a hardware decoding processor, or may be performed by a combination of hardware and software modules in the decoding processor. The software module may be located in a storage medium located in a memory. The processor reads information from the memory and performs the operations of the foregoing method in combination with its hardware.

In an exemplary embodiment, the detection device may be implemented by one or more application specific integrated circuits (ASICs), DSPs, Programmable Logic Devices (PLDs), Complex Programmable Logic Devices (CPLDs), Field Programmable Gate Arrays (FPGAs), general purpose processors, controllers, Micro Controller Units (MCUs), microprocessors, or other electronic components and may be configured to perform the foregoing methods.

Some embodiments of the present disclosure further provide a computer-readable storage medium having stored thereon computer programs that, when executed by a processor, cause the processor to implement the operations of the method described in the embodiments of the present disclosure.

The methods disclosed in the several method embodiments provided herein may be arbitrarily combined without conflict to obtain new method embodiments.

The features disclosed in the several product embodiments provided herein can be arbitrarily combined without conflict to yield new product embodiments.

The features disclosed in the several method or device embodiments provided herein may be arbitrarily combined without conflict to yield new method or device embodiments.

Those skilled in the art will appreciate that all or part of the operations of the method embodiments may be implemented by hardware related to program instructions. The programs may be stored in a computer-readable storage medium, and when the programs are executed, the operations in the above method embodiments are performed. The storage medium includes a removable storage device, a ROM, a RAM, a magnetic disk, an optical disk, or any other medium that can store program codes.

Optionally, the integrated unit of the present disclosure may be stored in a computer-readable storage medium if implemented in the form of a software functional module and sold or used as an independent product. Based on such an understanding, the technical solutions of the embodiments of the present disclosure, or portions contributing to the prior art, may be embodied in the form of software products stored in a storage medium including instructions used for causing a computer device (which may be a personal computer, a server, a network device, or the like) to perform all or the part of the methods described in the embodiments of the present disclosure. The storage medium includes a removable storage device, an ROM, an RAM, a magnetic disk, an optical disk, or any other medium that can store program codes.

The above descriptions are merely implementations in the embodiments of the present disclosure, but the protection scope of the embodiments of the present disclosure is not limited thereto. Any change or replacement readily figured out by a person skilled in the art within the technical scope disclosed in the embodiments of the present disclosure shall fall within the protection scope of the embodiments of the present disclosure. Therefore, the protection scope of the embodiments of the present disclosure shall be subject to the protection scope of the claims.

The invention claimed is:

1. A detection circuit, comprising:
a first capacitive component;
a second capacitive component;
a load to be detected; and
a detection component; wherein the first capacitive component is connected in series with the load to be detected to form a first branch, and the first branch is connected in parallel with a second branch comprising the second capacitive component; and
the detection component is configured to detect a first alternating current (AC) signal of the first branch and a second AC signal of the second branch, determine a first direction of the first AC signal and a second direction of the second AC signal, and determine a type of the load to be detected based on the first direction and the second direction, wherein the detection component is configured to detect whether an included angle between the first direction and the second direction is within a first preset range; in a case where it is detected that the included angle between the first direction and the second direction is within the first preset range, determine that the type of the load to be detected is a power transmission load; and in a case where it is detected that the included angle between the first direction and the second direction is not within the first preset range, determine that the type of the load to be detected is a heating load.

2. The detection circuit of claim 1, wherein the first capacitive component comprises a first capacitor; or
the first capacitive component comprises the first capacitor and at least one of a first inductor or a first resistor, the first capacitor being connected in series with the at least one of the first inductor or the first resistor; and
wherein the second capacitive component comprises a second capacitor; or
the second capacitive component comprises the second capacitor and at least one of a second inductor or a second resistor, the second capacitor being connected in series with the at least one of the second inductor or the second resistor.

3. The detection circuit of claim 1, further comprising a third branch comprising an inductive component, wherein an end of the third branch is connected to an AC power source, the third branch is connected in series with the first branch and the second branch respectively; a third AC signal of the third branch comprises the first AC signal and the second AC signal; and the inductive component is configured to perform filtering or compensation processing on an AC signal output from the AC power source.

4. The detection circuit of claim 3, wherein the detection component is configured to detect a first moment corresponding to a voltage zero-crossing point of the third AC signal and a second moment corresponding to a current zero-crossing point of the third AC signal, and determine the type of the load to be detected based on the first moment and the second moment.

5. The detection circuit of claim 4, wherein the detection component is configured to detect whether a difference between the first moment and the second moment is within a second preset range; in a case where it is detected that the difference between the first moment and the second moment is within the second preset range, determine that the type of the load to be detected is a power transmission load; and in a case where it is detected that the difference between the first moment and the second moment is not within the second preset range, determine that the type of the load to be detected is a heating load.

6. The detection circuit of claim 3, wherein the inductive component comprises a third inductor; or
the inductive component comprises the third inductor and at least one of a third capacitor or a third resistor, the third inductor being connected in series with the at least one of the third capacitor and the third resistor.

7. An appliance comprising the detection circuit of claim 1, wherein the appliance further comprises a control component configured to control the appliance to be in a corresponding operating mode based on the type of the load to be detected determined by the detection component of the detection circuit.

8. The appliance of claim 7, wherein the load to be detected comprises a cookware or a power receiving device; and
the control component is configured to heat, through a coil plate of the appliance, the cookware placed on the coil plate in a case where the type of the load to be detected determined by the detection component is a heating load; and transmit, through the coil plate of the appliance, power to the power receiving device placed on the coil plate in a case where the type of the load to be detected determined by the detection component is a power transmission load.

9. The detection circuit of claim 1, wherein the included angle between the first direction and the second direction is an included angle between a current direction of the first AC signal of the first branch and a current direction of the second AC signal of the second branch.

10. A control method, applied to the appliance of claim 7, the method comprising:
obtaining a first alternating current (AC) signal of a first branch and a second AC signal of a second branch in a detection circuit, and determining a first direction of the first AC signal and a second direction of the second AC signal, wherein the first branch comprises a first capacitive component and a load to be detected connected in series, and the first branch is connected in parallel with a second branch comprising a second capacitive component;
determining a type of the load to be detected based on the first direction and the second direction; and
controlling the appliance to be in a corresponding operating mode based on the type of load, wherein determining the type of the load to be detected based on the first direction and the second direction comprises:
detecting whether an included angle between the first direction and the second direction is within a first preset range; and
in a case where it is detected that the included angle between the first direction and the second direction is within the first preset range, determining that the type of the load to be detected is a power transmission load; and in a case where it is detected that the included angle between the first direction and the second direction is not within the first preset range, determining that the type of the load to be detected is a heating load.

11. The method of claim 10, further comprising:
obtaining a third AC signal of a third branch of the detection circuit, and determining a first moment corresponding to a voltage zero-crossing point of the third AC signal and a second moment corresponding to a current zero-crossing point of the third AC signal; and
determining the type of the load to be detected based on the first moment and the second moment.

12. The method of claim 11, wherein determining the type of the load to be detected based on the first moment and the second moment comprises:
detecting whether a difference between the first moment and the second moment is within a second preset range;
in accordance with a determination that the difference detected between the first moment and the second moment is within the second preset range:
determining that the type of the load to be detected is a power transmission load; and
in accordance with a determination that the difference detected between the first moment and the second moment is not within the second preset range:
determining that the type of the load to be detected is a heating load.

13. A computer-readable storage medium having stored thereon computer programs that, when executed by a processor, cause the processor to implement the operations of the method of claim 10.

14. A detection device, comprising a processor and a memory storing computer programs capable of running on the processor, wherein the processor is configured to perform the operations of the method of claim 10 when the computer programs are executed.

15. The control method of claim 10, wherein the included angle between the first direction and the second direction is an included angle between a current direction of the first AC signal of the first branch and a current direction of the second AC signal of the second branch.

16. A control method, comprising:

obtaining a first alternating current (AC) signal of a first branch and a second AC signal of a second branch in a detection circuit, determining a first direction of the first AC signal and a second direction of the second AC signal, wherein the first branch comprises a first capacitive component and a load to be detected connected in series, and the first branch is connected in parallel with a second branch comprising a second capacitive component;

determining a type of the load to be detected based on the first direction and the second direction; and controlling an appliance to be in a corresponding operating mode based on the type of load, wherein determining the type of the load to be detected based on the first direction and the second direction comprises:

detecting whether an included angle between the first direction and the second direction is within a first preset range; and in a case where it is detected that the included angle between the first direction and the second direction is within the first preset range, determining that the type of the load to be detected is a power transmission load; and in a case where it is detected that the included angle between the first direction and the second direction is not within the first preset range, determining that the type of the load to be detected is a heating load.

* * * * *